United States Patent
Woo et al.

(10) Patent No.: US 6,724,051 B1
(45) Date of Patent: Apr. 20, 2004

(54) NICKEL SILICIDE PROCESS USING NON-REACTIVE SPACER

(75) Inventors: Christy Mei-Chu Woo, Cupertino, CA (US); Minh Van Ngo, Fremont, CA (US); George Jonathan Kluth, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/679,877

(22) Filed: Oct. 5, 2000

(51) Int. Cl.[7] ............... H01L 29/76; H01L 29/94; H01L 31/062; H01L 31/113; H01L 31/119
(52) U.S. Cl. ............ 257/382; 257/413; 257/900
(58) Field of Search ................ 257/900, 382, 257/413

(56) References Cited

U.S. PATENT DOCUMENTS

| | | | | |
|---|---|---|---|---|
| 5,882,983 A | * | 3/1999 | Gardner et al. | 438/424 |
| 5,990,558 A | * | 11/1999 | Tran | 257/759 |
| 6,124,164 A | * | 9/2000 | Al-Shareef et al. | 438/240 |
| 6,194,258 B1 | * | 2/2001 | Wuu | 438/200 |
| 6,194,748 B1 | * | 2/2001 | Yu | 257/216 |
| 6,214,710 B1 | * | 4/2001 | Park et al. | 438/586 |
| 6,218,344 B1 | * | 4/2001 | Gschwender et al. | 508/431 |
| 6,262,445 B1 | * | 7/2001 | Swanson et al. | 257/900 |
| 6,291,278 B1 | * | 9/2001 | Xiang et al. | 438/197 |
| 6,313,510 B1 | * | 11/2001 | Kim et al. | 257/900 |
| 6,351,013 B1 | * | 2/2002 | Luning et al. | 257/388 |
| 6,395,152 B1 | * | 5/2002 | Wang | 204/224 |
| 6,399,452 B1 | * | 6/2002 | Krishnan et al. | 438/305 |
| 6,406,743 B1 | * | 6/2002 | Lee et al. | 427/98 |
| 6,433,433 B1 | * | 8/2002 | Sengupta | 257/763 |
| 6,472,076 B1 | * | 10/2002 | Hacker | 428/447 |

FOREIGN PATENT DOCUMENTS

| | | | | |
|---|---|---|---|---|
| JP | 63-72163 | * | 4/1988 | 257/900 |
| JP | 64-761 | * | 1/1989 | 257/900 |
| JP | 1-217909 | * | 8/1989 | 257/900 |

OTHER PUBLICATIONS

English translation of Japanese Kokai 64–761.*
Spectroscopic ellipsometry investigation of nickel silicide formation by rapid thermal process. Yaozhi Hu, Sing Pin Tay, Feb. 9, 1998 pp. 1820–1824.
Properties of Metal Silicides–Kinetics of formation of TM Silicide thin fils: self–diffusion P. Gas, F.M. d'Heurle, Jan. 1995 pp. 279–292.

* cited by examiner

*Primary Examiner*—Amir Zarabian
*Assistant Examiner*—Ida M. Soward

(57) ABSTRACT

A MOSFET semiconductor device includes a substrate, a gate electrode, a gate oxide, first and second sidewall spacers, and nickel silicide layers. The gate oxide is disposed between the gate electrode and the substrate, and the substrate includes source/drain regions. The gate electrode has first and second opposing sidewalls, and the first and second sidewall spacers are respectively disposed adjacent the first and second sidewalls. The first and second sidewall spacers are formed from a low-K spacer material that is substantially non-reactive with nickel, for example, SiHC, hydrogen silsesquioxane and methyl silsesquioxane. The nickel silicide layers are disposed on the source/drain regions and the gate electrode. A method of manufacturing the semiconductor device is also disclosed.

7 Claims, 5 Drawing Sheets

NICKEL SILICIDE PROCESS USING NON-REACTIVE SPACER

FIELD OF THE INVENTION

The present invention relates to the manufacturing of semiconductor devices, and more particularly, to nickel silicide processes that prevent silicide shorting.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the dimensions of the MOSFET shrinks, contacts and spacing between contacts also decrease in size, and increased performance requires that contact resistance remain relatively low. Contacts are formed after the source/drain regions have been formed within the semiconductor substrate of the MOSFET and the gate areas defined. An interlevel dielectric is then formed across the topography to isolate the gate areas and the source/drain regions. Interconnect routing is then placed across the semiconductor topography and connected to the source/drain regions and/or the gate areas by ohmic contacts formed through the interlevel dielectric.

The entire process of making ohmic contacts to the impurity regions and/or the gate areas and routing interconnect material between the ohmic contacts is described generally as "metallization". The term metallization is generic in its application, as conductive materials other than metal are commonly used for metallization. As the complexity of integrated circuits has increased, the complexity of the metallization composition has also increased, which leads to a further problem.

Metallization typically involves patterning a protective mask upon areas of the interlevel dielectric exclusive of where the ohmic contact is to be formed. The area of the interlevel dielectric left uncovered by the mask is then etched to form an opening or window directly above the source/drain regions and/or the gate areas to which contact is to be made. The contact window is then filled with a conductive material. A problem associated with this process is that the mask, and hence the contact, may be misaligned with the areas to which contact is to be made, resulting in increased resistance at that interface. Furthermore, aligning contact windows via a separate masking step makes minimizing the size of source/drain regions difficult.

Performance improvements have been obtained by solving the problems of increased resistance and misalignment through use of a salicide process (Self-ALIgned-siliCIDE). This process has become a mainstay in semiconductor processing because the process produces contacts having low-ohmic resistance and the contacts are formed using a self-aligned process.

A salicide process involves depositing a refractory metal across the semiconductor topography. After the refractory metal is deposited and subjected to high enough temperature, a silicide reaction occurs wherever the metal is in contact with a region heavily concentrated with silicon. In this manner, metal silicide may be formed exclusively upon the source/drain regions and the upper surface of a polycrystalline silicon ("polysilicon") gate conductor interposed between the source/drain regions. Silicide formation formed upon a polysilicon gate is generally referred to as polycide gate, which significantly reduces the resistance of the gate structure, as compared to previously used polysilicon gate structures. Silicide formation on the source/drain regions also significantly reduce the resistance of the contacts to the source/drain regions. Any unreacted metal is removed after formation of the silicide.

A number of different techniques and fabrication processes have been used to form MOSFET devices using the salicide process. With reference to FIGS. 1A–1I, one typical MOSFET fabrication process according to conventional techniques will be described. In FIG. 1A, separate MOSFET devices are separated on a silicon substrate 102 using isolation structures, such as a field oxide (not shown) or a shallow isolation trench 216. A shallow isolation trench 216, for example, can be formed by etching either isotropically with wet techniques or anisotropically with dry etch techniques. An oxide 218 is 30 thereafter deposited within the trench 216. The oxide 218 is deposited such that an edge 220 of the oxide 218 meets the substrate 102 at what will later be lightly doped regions within the substrate 102. For purposes of clarity, the trench 216 and the oxide 218 are not shown in FIGS. 1B–1I.

In FIG. 1B, a gate oxide 104, formed from silicon dioxide, is formed on the top surface of the substrate 102 using thermal oxidation at temperatures from 700 to 1000° C. in an oxygen atmosphere. After deposition of the gate oxide 104, a blanket layer of undoped polysilicon 106 is deposited, for example by low pressure chemical vapor deposition (LPCVD), on the top surface of gate oxide 104. The polysilicon layer 106 deposited on the substrate 102 can then be implanted with nitrogen ions, as depicted by arrows 160. The nitrogen ions are added to retard the diffusion of boron atoms.

In FIG. 1C, a photoresist 110 is deposited as a continuous layer on the polysilicon layer 106, and the photoresist 110 is selectively irradiated using a photolithographic system, such as a step and repeat optical projection system, in which ultraviolet light from a mercury-vapor lamp is projected through a first reticle and a focusing lens to obtain a first image pattern. The photoresist 110 is then developed and the irradiated portions of the photoresist are removed to provide openings in the photoresist 110. The openings expose portions of the polysilicon layer 106 which will thereby define a gate electrode.

In FIG. 1D, an anisotropic etch is applied to remove the exposed portions of the polysilicon layer 106 and the underlying portions of the gate oxide 104. After etching, the remaining portion of polysilicon layer 106 provides a polysilicon gate 112 with opposing vertical sidewalls (or, edges) 114, 116.

In FIG. 1E, the photoresist 110 is stripped, and lightly doped (LDD) source/drain regions 130, 132 are formed by an ion implantation, as represented by arrows 128. The ion implantation may be an n-type dopant, such as arsenic, if an NMOSFET is desired, or a p-type dopant, such as boron, if a PMOSFET is desired. The LDD source/drain regions 130, 132 are formed within the substrate 102 immediately adjacent to the sidewalls 114, 116 and are self-aligned with the polysilicon gate 112.

In FIG. 1F, sidewall spacers 162, 164 are formed following the implantation of the LDD source/drain regions 130, 132. The sidewall spacers 162, 164 may be silicon nitride or, alternatively, silicon oxide formed from material such as plasma-enhanced oxide (PEOX) or tetraethoxysilane (TEOS) oxide. The sidewall spacers 162 and 164 are formed immediately adjacent to the polysilicon gate 112 and over the substrate 102. After formation of the sidewall spacers 162, 164, heavily doped (HDD) source/drain regions 200, 202 are formed by a second ion implantation, as represented by arrows 204. The HDD source/drain regions 200, 202 are formed within the substrate 102 and extend past the LDD regions 130, 132 immediately adjacent to the sidewall spacers 162, 164. The sidewall spacers 162, 164 act as masks, which protect portions of the LDD regions 130, 132 from being heavily doped.

In FIG. 1G, a metal silicide is formed following the creation of the source/drain regions 130, 132. This process involves blanket depositing a layer of nickel 140, or other metals such as titanium and cobalt, over the polysilicon gate electrode 112 and the source/drain regions 130, 132 of the substrate 102. Although titanium and cobalt have been used to form silicide layers, nickel silicide (NiSi) has recently become a preferred silicide material for several reasons. An advantage of nickel silicide is that it can be rapidly formed at low temperature (400–600° C.), making it suitable for low temperature processes in MOSFET fabrication. Other advantages of nickel silicide include no linewidth dependence, a reduction in "creep up" phenomenon, low resistivity, a one-step anneal, a larger process window, and low silicon consumption. Yaozhi Hu and Sing Pin Tay, "Spectroscopic Ellipsometry Investigation of Nickel Silicide Formation by Rapid Thermal Process", J. Vac. Sci. Technol. A 16(3), May/June 1998, 1820.

In FIG. 1H, the nickel layer 140 is transformed into nickel silicide 142 by a one-step thermal process, which causes the underlying silicon substrate 102 or polysilicon gate electrode 112 to react with the nickel layer 140 to form nickel silicide 142. This thermal process is typically a rapid thermal anneal at temperatures of between about 350° C. to 750° C. A typical process is a 550° C. anneal for about 40 seconds in a nitrogen atmosphere. The formation of nickel silicide begins at about 250° C. when the nickel layer 140 reacts with silicon 102, 112 to form a $Ni_2Si$ film. With an increase in time or an increase in temperature to above. 300° C., the $Ni_2Si$ film reacts with the silicon 102, 112 to form the NiSi layer 142. The square of the thickness of the NiSi layer 142 varies linearly with time and the reaction proceeds until the $Ni_2Si$ film is totally consumed. P. Gas and F. M. d'Heurle, "Kinetics of Formation of TMM Silicide Thin Films: Self-diffusion", Properties of Metal Silicides, January 1995, 279.

In FIG. 1I, the nickel layer 140 over the sidewall spacers 162, 164 and the shallow isolation trench 216 is not reacted and can be removed easily. The unreacted nickel layer 140 can be removed, for example, using a $H_2SO_4 + H_2O_2$ (2:1) mixture at a temperature of about 100° C. Although $NOH_4OH + H_2O_2$ with deionized water is used for stripping silicide metals, such as with cobalt, titanium, or titanium nitride, this particular etch is not used with nickel. Nickel does not have a cap layer above the silicide metal, unlike the other materials, and removal of the cap layer is the main reason that $NH_4OH + H_2O_2$ with deionized water is used for the other types of silicides.

A problem associated with this process is bridging, also known as silicide shorting. Bridging can arise when a silicide, such as nickel silicide, is formed between the silicon contact windows, such as between the gate electrode 112 and the source/drain regions 130, 132 arranged within the silicon substrate 102. The "bridge" between the gate electrode 112 and the source/drain regions 130, 132 creates a capacitivecoupled or fully conductive path, or "short" between the gate electrode 112 and the source/drain regions 130, 132 and can lead to malfunction of the semiconductor device. As illustrated in FIG. 2, a common bridge 144 occurs when nickel silicide forms on the sidewall spacers 162, 164 between the gate electrode 112 and the source/drain regions 130, 132.

One mechanism in which a nickel silicide bridge 144 is formed on the sidewall spacers 162, 164 is by silicon atoms within the sidewall spacers 162, 164 diffusing into regions of nickel deposited over the sidewall spacers 162, 164, or vice versa. The silicon and nickel then react over or within the spacer regions during the rapid thermal annealing process, causing the nickel silicide to form on the sidewall spacers 162, 164.

Another mechanism that can cause bridging is significant thinning of the sidewall spacers 162, 164. Sidewall spacers 160, 162 serve to prevent the deposited nickel from contacting with, and hence reacting with, the polysilicon at the sidewall surfaces of the gate electrode 112. Without the sidewall spacers 162, 164, nickel silicide could form upon the sidewall surfaces of the gate electrode 112 and undesirably cause bridging between the gate electrode 112 and the source/drain regions 130, 132. Prior to metal deposition, native oxide on the exposed top surface of the gate electrode 112, as well as the top surface of the source/drain region 130, 132, is removed to allow for successful nickel silicide formation, as the native oxide will prevent the reaction between the nickel and the exposed silicon surfaces during annealing. The removal of the native oxide prior to metal deposition is typically performed using a buffered hydrofluoric acid procedure. However, this process can cause the sidewall spacers 162, 164 to be defective, or significantly thinned, thereby exposing the polysilicon of the gate electrode 112 and causing unwanted nickel silicide formation.

One technique of reducing unwanted nickel silicide formation in the sidewall spacer region is to lower the temperature at which the rapid thermal anneal takes place. At lower temperatures of about 380 to 420° C., there is reduced diffusion of both nickel and silicon atoms. The disadvantage of using these lower temperatures for the rapid thermal anneal process, however, is that the lower temperature also lowers the growth rate of nickel silicide and therefore the processing time increases, which lowers throughput and increases the cost of processing. Accordingly, a need exists for an improved method of nickel silicide formation that reduces or eliminates bridging or silicide shorting and also allows for higher temperatures during the rapid thermal anneal process.

SUMMARY OF THE INVENTION

This and other needs are met by embodiments of the present invention which provide a MOSFET semiconductor device, which includes a substrate, a gate electrode, a gate oxide, first and second sidewall spacers, and nickel silicide layers. The gate oxide is disposed between the gate electrode and the substrate, and the substrate includes source/drain regions. The nickel silicide layers are disposed on the source/drain regions and the gate electrode. The gate electrode has first and second opposing sidewalls, and the first and second sidewall spacers are respectively disposed adjacent the first and second sidewalls.

The first and second sidewall spacers are formed from a low-K spacer material that is substantially non-reactive with nickel, for example, SiHC, hydrogen silsesquioxane and methyl silsesquioxane.

By using a spacer material that is substantially non-reactive with nickel the present invention prevents nickel silicide from forming on the sidewall spacers, thereby preventing malfunction of the semiconductor device from silicide shorting. Also, because the material of the sidewall spacers are substantially non-reactive with nickel, a higher temperature can be used during the rapid thermal anneal, which allows for greater throughput and lower costs of processing.

In an additional embodiment of the present invention, a method of manufacturing a semiconductor device is also disclosed. The method of manufacturing includes providing a gate electrode having first and second opposing sidewalls over a substrate having source/drain regions and a gate oxide therebetween; forming first and second sidewall spacers respectively disposed adjacent the first and 10 second sidewalls; and forming nickel silicide layers disposed on the source/drain regions and the gate electrode. The first and second sidewall spacers are formed from a spacer material substantially non-reactive with nickel. The nickel silicide can also be formed during a rapid thermal anneal at temperatures from about 380 to 600° C.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of silicide shorting as a result of nickel silicide being deposited on sidewall spacers during a salicide process. This is achieved, in part, by providing sidewall spacers formed from a low dielectric material that does not react easily with nickel. Advantageously, because the material of the sidewall spacers does not react easily with nickel, the amount of nickel silicide formed on the sidewall spacers is reduced or eliminated. Additionally, the reduction of unwanted nickel silicide on the sidewall spacers allows a higher temperature to be utilized during the rapid thermal anneal process, which will advantageously decrease processing times.

Figure 1A:
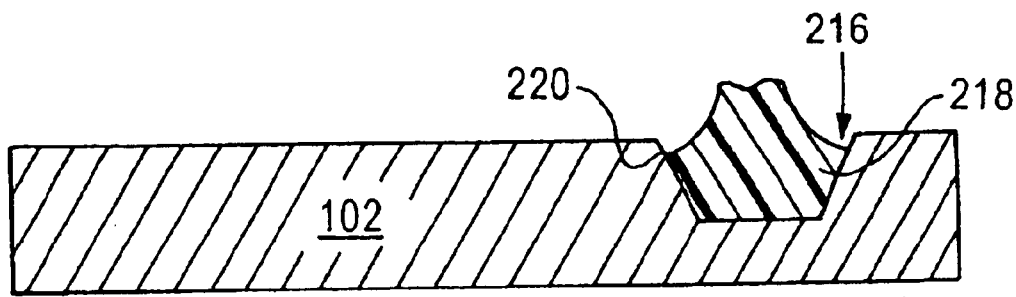
FIGS. 1A–1I schematically illustrate sequential phases of a conventional MOS fabrication method using a salicide process.
Figure 1B:
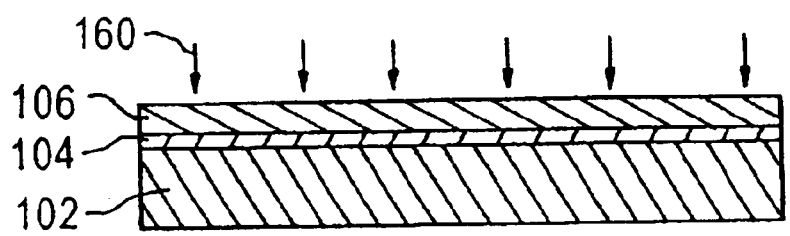
Figure 1C:
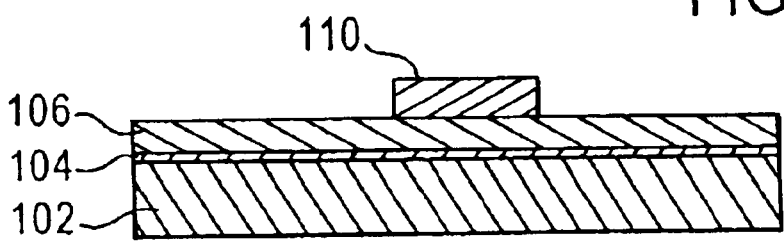
Figure 1D:
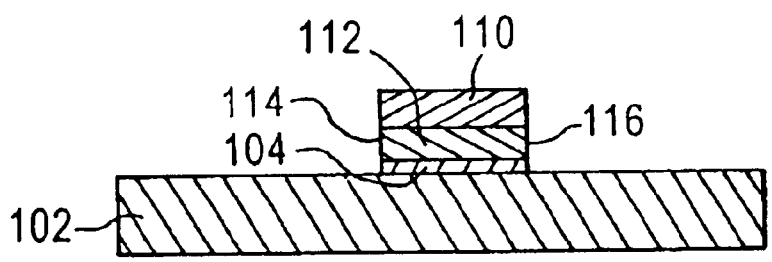
Figure 1E:
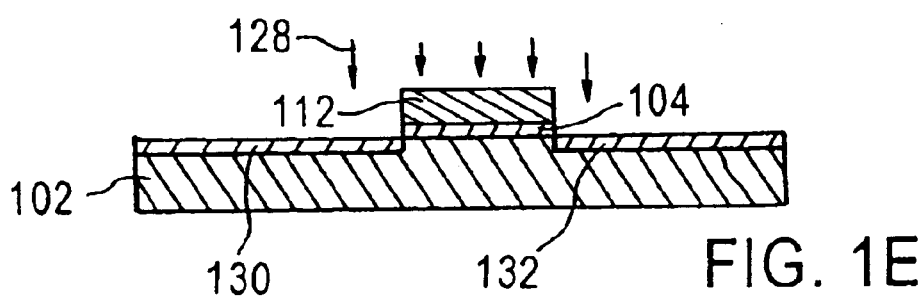
Figure 1F:
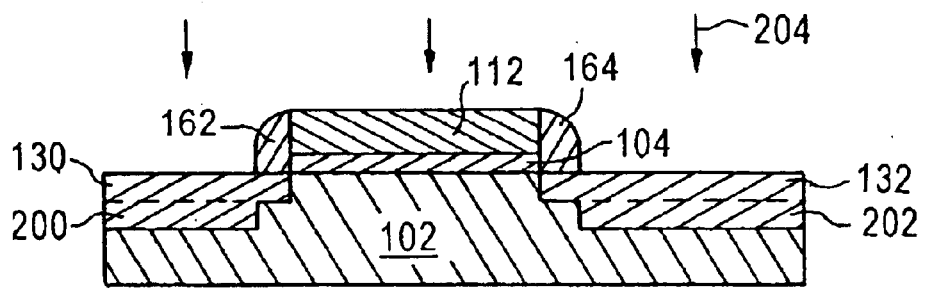
Figure 1G:
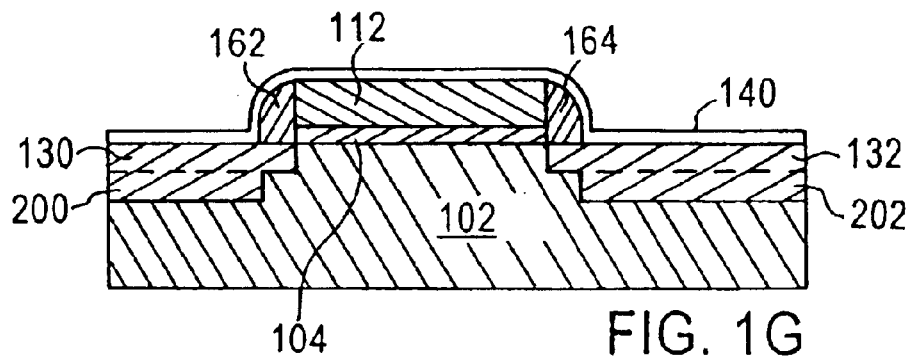
Figure 1H:
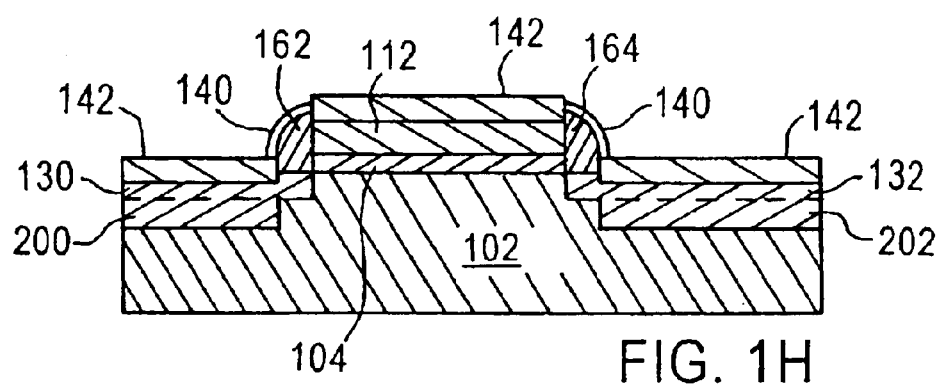
Figure 1I:
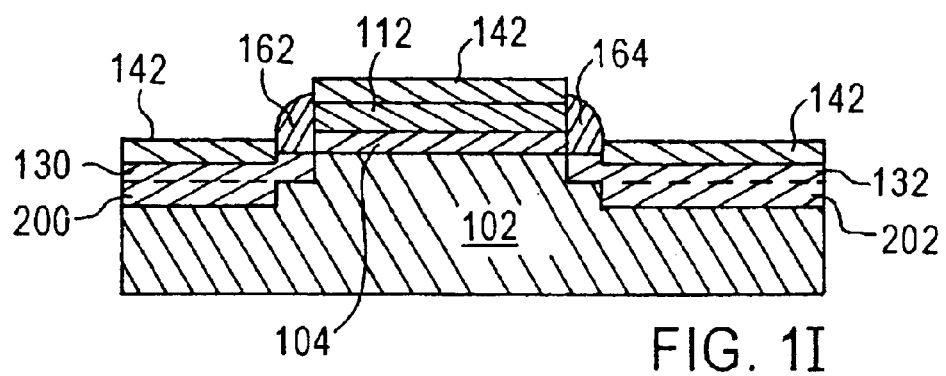
Figure 2:
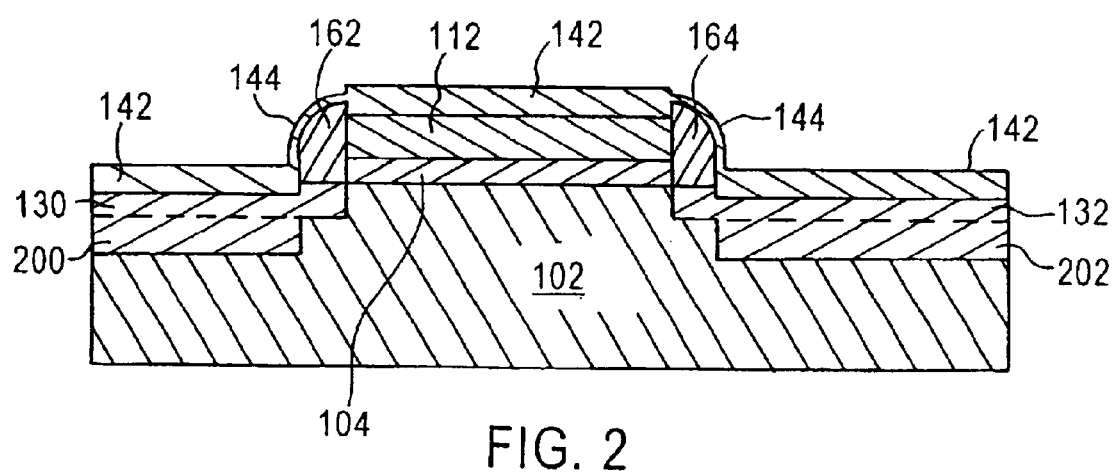
FIG. 2 illustrates a MOS device having a silicide bridge formed between the gate electrode and the source/drain regions.
Figure 3A:
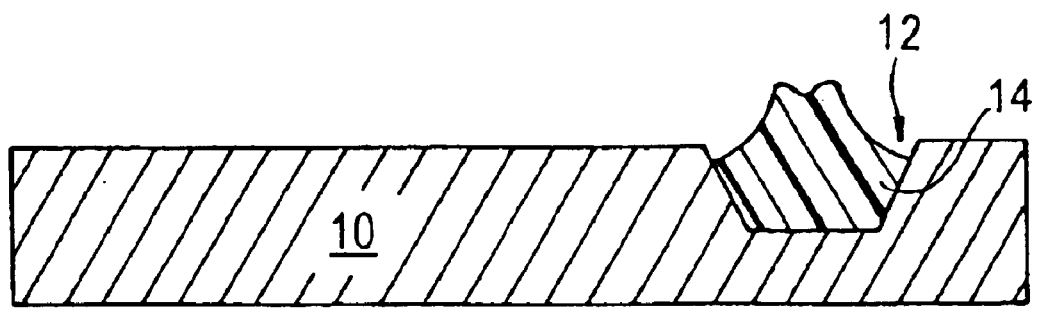
FIGS. 3A–3I schematically illustrate sequential phases of a MOS fabrication method using a salicide process according to an embodiment of the present invention.

An embodiment of the present invention is illustrated in FIGS. 3A–3I. As illustrated in FIG. 3A, a silicon substrate 10 is provided and can be formed from any material suitable for integrated circuit manufacture. However, in current embodiments of the invention, the substrate 10 is formed from single-crystal silicon, with a <100> crystallographic orientation and which has been slightly doped with n-type or p-type impurities. Separate MOS devices are separated on a silicon substrate 10 using isolation structures, such as a field oxide (not shown) or a shallow isolation trench 12. A shallow isolation trench 12, for example, can be formed by etching either isotropically with wet techniques or anisotropically with dry etch techniques. An oxide 14 is thereafter deposited within the trench 12. For purposes of clarity, the trench 12 and the oxide 14 are not shown in FIGS. 3B–3I.

As an alternative to the shallow isolation trench 12, a field oxide can be formed. A field oxide can be formed via thermal oxidation in an oxygen-steam ambient at temperatures from about 850 to 1050° C. A patterned, oxidation-resistant mask is used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 3B:
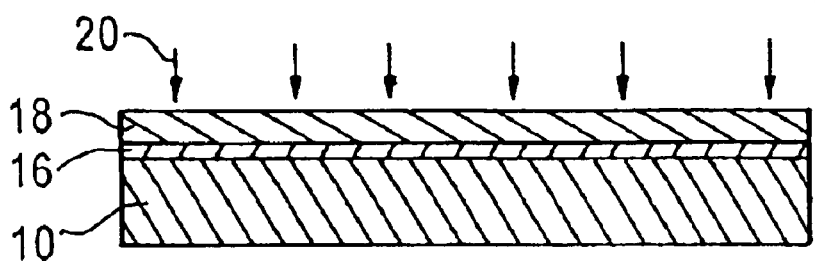

In FIG. 3B, a gate oxide 16, comprised of silicon dioxide, is formed on the top surface of the substrate 10 using thermal oxidation at temperatures from about 700 to 1000° C. in an oxygen-steam ambient. The gate oxide 16 can have a thickness from about 30 to 200 angstroms. After deposition of the gate oxide 16, a blanket layer of undoped polysilicon 18 is deposited, for example by low pressure chemical vapor deposition (LPCVD) at temperatures from about 600 to 800° C., on the top surface of gate oxide 16. The polysilicon layer 18 can have a thickness from about 500 to 5000 angstroms. The polysilicon layer 18 can then be implanted with nitrogen ions, as depicted by arrows 20. The implanted nitrogen ions, for example, can be used to retard the diffusion of boron atoms. The polysilicon layer 18 can be implanted with nitrogen ions at a dosage from about $5 \times 10^{14}$ to $5 \times 10^{15}$ dopants/cm$^2$, and at an energy level from about 20 to 200 keV.

Figure 3C:
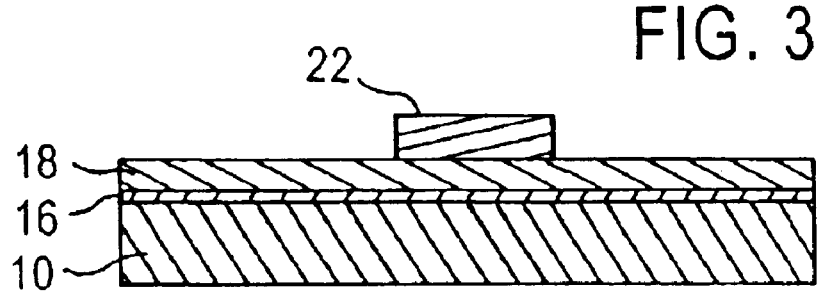

In FIG. 3C, a photoresist 22 is deposited as a continuous layer on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define a gate electrode.

Figure 3D:
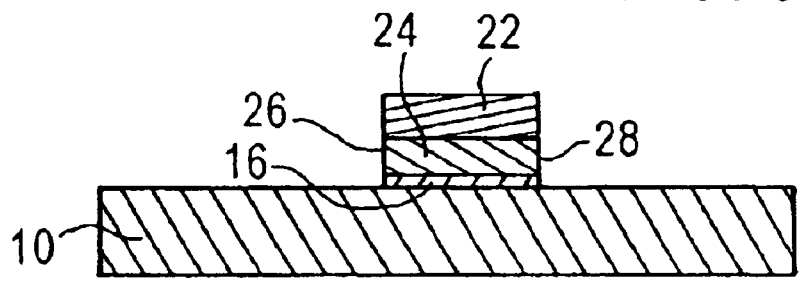

In FIG. 3D, an anisotropic etch is applied to remove the exposed portions of the polysilicon layer 18 and the underlying portions of the gate oxide 16. After etching, the remaining portion of polysilicon layer 18 provides a polysilicon gate electrode 24 having opposing vertical sidewalls 26, 28. The length of the polysilicon gate electrode 24 between the sidewalls 26, 28 can be from about 500 to 2500 angstroms.

Figure 3E:
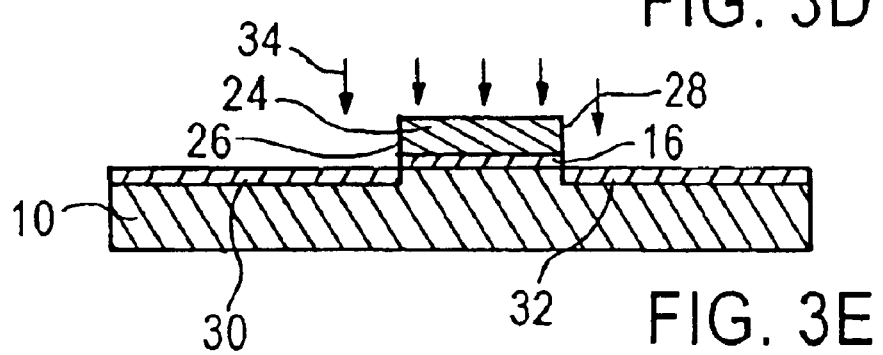

In FIG. 3E, the photoresist 22 is stripped, and lightly doped (LDD) source/drain active regions 30, 32 are formed by an ion implantation, as represented by arrows 34. The ion implantation may be an n-type dopant, such as arsenic, if an NMOSFET is desired, or a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/cm$^2$. The LDD source/drain regions 30, 32 are formed within the substrate 10 immediately adjacent to the sidewalls 26, 28 and are self-aligned with the polysilicon gate electrode 24 and the isolation structure.

Figure 3F:
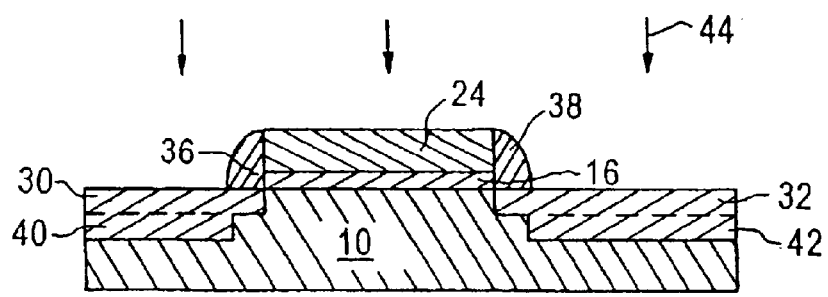

In FIG. 3F, sidewall spacers 36, 38 are formed following the implantation of the LDD source/drain regions 30, 32. Formation of the sidewall spacers 36, 38 involves depositing a spacer material over the substrate 10. The spacer material is preferably a low-K material that is substantially non-reactive with nickel, such that the spacer material does not react with nickel to form sufficient amounts of nickel silicide during a rapid thermal annealing process to cause malfunction of the semiconductor device. In current embodiments of the invention, the spacer material can be formed from SiHC, hydrogen silsesquioxane (HSQ) or methyl silsesquioxane (MSQ). These materials are exemplary only, as other low-K materials may be used without departing from the scope of the invention, as long as they are substantially non-reactive with nickel. The blanket deposition is followed by an anisotropic etch, which removes the spacer material except for the sidewall spacers 36, 38 immediately adjacent to the sidewalls 26, 28 of the polysilicon gate electrode 24 and over the substrate 10.

After formation of the sidewall spacers 36, 38, heavily doped (HDD) source/drain regions 40, 42 can be optionally formed by a second ion implantation, as represented by arrows 44. The HDD source/drain regions 40, 42 are formed within the substrate 10 and extend past the LDD source/drain regions 30, 32 immediately adjacent to the sidewall spacers 36, 38. The sidewall spacers 36, 38 act as masks which protect portions of the LDD source/drain regions 30, 32 from being heavily doped and which prevent silicide formation on the sidewalls 26, 28 of the polysilicon gate electrode 24.

Figure 3G:
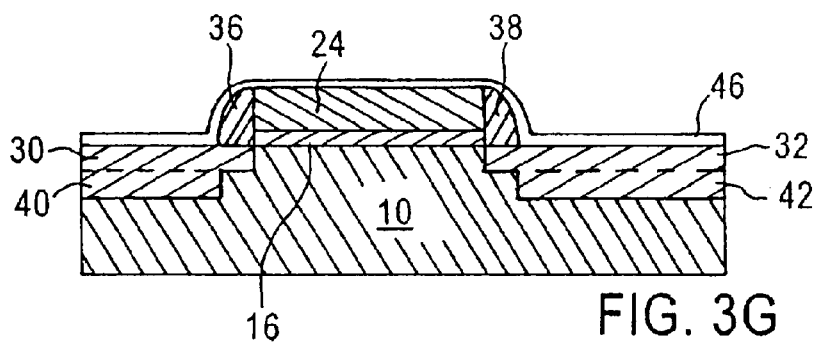

In FIG. 3G, nickel silicide is formed following the creation of the source/drain active regions 30, 32. This process involves blanket depositing a layer of nickel 46 over the polysilicon gate electrode 24 and the source/drain regions 30, 32 of the substrate 10. An illustrative example of a process capable of depositing the layer of nickel 46 is physical vapor deposition (PVD) from a nickel target. The thickness of the nickel layer 46 can be from about 80 to 200 angstroms, and most preferably from about 120 to 180 angstroms.

Figure 3H:
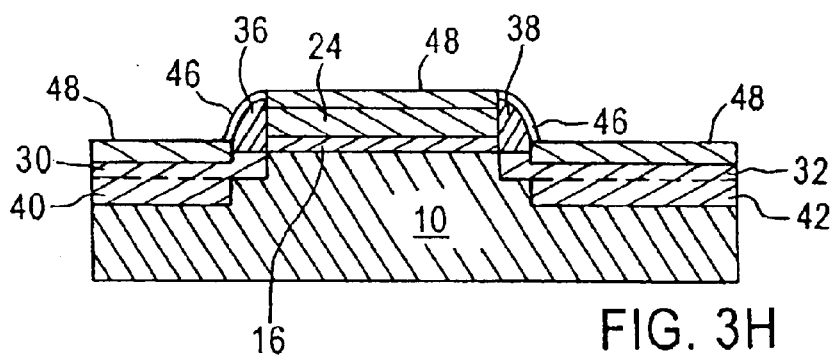

In FIG. 3H, the nickel layer 46 is transformed into nickel silicide 48 by a one-step thermal process, which causes the silicon in the source/drain regions 30, 32 of the substrate 10 or the polysilicon gate electrode 24 to react with the nickel layer 46 to form a nickel silicide layer 48. This thermal process is commonly known as rapid thermal annealing. Because the sidewall spacers 36, 38 are formed from a spacer material that is substantially non-reactive with nickel, the temperature range during the rapid thermal anneal can be from about 380 to 600° C., and particularly advantageously, the temperature can be greater than 420° C. The rapid thermal anneal is typically performed for about 30 to 60 seconds in a nitrogen atmosphere.

Figure 3I:
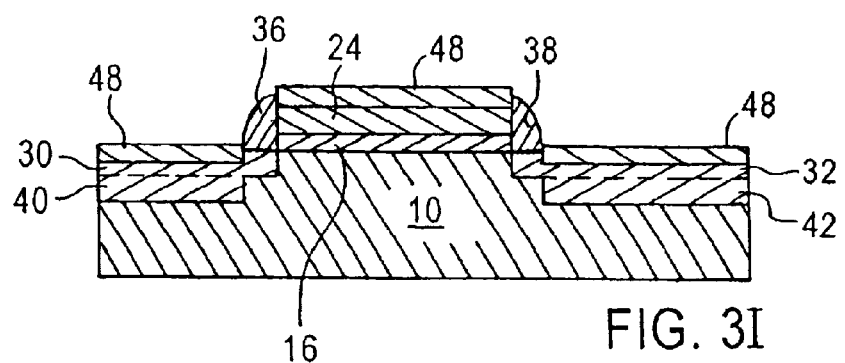

During this rapid thermal anneal, the nickel silicide forms on the gate electrode 24 and the source/drain regions 30, 32. However, nickel silicide does not form on the sidewall spacers 36, 38 because the sidewall spacers 36, 38 are made of a material that is substantially non-reactive with nickel. As such, silicide shorting or bridging is substantially eliminated. In FIG. 3I, the unreacted nickel layer 46 over the sidewall spacers 36, 38 and the shallow isolation trench 12 (or field oxide) is removed. The unreacted nickel layer 46 can be removed using a wet chemical etch. The wet chemical etch preferably exhibits high selectivity for the unreacted metal 46 relative to the silicide 48. In current embodiments of the invention, the etch is a sulfuric peroxide mixture $H_2SO_4:H_2O_2$ (3:1) with deionized $H_2O$ at a temperature of about 100° C. The removal rate of nickel at the 3:1 ratio is about 10,000 angstroms/minute.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A semiconductor device, comprising:

a substrate having source/drain regions;

a gate electrode having first and second opposing sidewalls;

a gate oxide disposed between said gate electrode and said substrate;

first and second sidewall spacers respectively disposed adjacent said first and second sidewalls; and nickel silicide layers disposed on said source/drain regions and said gate electrode, wherein said first and second sidewall spacers are formed from a spacer material substantially non-reactive with nickel at temperatures above 420° C.

2. The semiconductor device according to claim 1, wherein said spacer material is SiHC.

3. The semiconductor device according to claim 1, wherein said spacer material is hydrogen silsesquioxane.

4. The semiconductor device according to claim 1, wherein said spacer material is methyl silsesquioxane.

5. The semiconductor device according to claim 1, wherein said spacer material is a low-K material.

6. The semiconductor device according to claim 1, wherein said semiconductor device is a MOSFET.

7. A semiconductor device, comprising:

a substrate having source/drain regions;

a gate electrode having first and second opposing sidewalls;

a gate oxide disposed between said gate electrode and said substrate;

first and second sidewall spacers respectively disposed adjacent said first and second sidewalls; and, nickel silicide layers disposed on said source/drain regions and said gate electrode, wherein said first and second sidewall spacers are formed from a spacer material substantially non-reactive with nickel selected from the group comprising SiHC, hydrogen silsequioxane and methyl silsequioxane.

* * * * *